(12) United States Patent  
Choi et al.

(10) Patent No.: US 9,298,092 B2
(45) Date of Patent: *Mar. 29, 2016

(54) METHOD FOR IMPROVING PRINT PERFORMANCE IN FLEXOGRAPHIC PRINTING PLATES

(71) Applicant: MacDermid Printing Solutions, LLC, Waterbury, CT (US)

(72) Inventors: Jonghan Choi, Smyrna, GA (US); Chouaib Boukaftane, Smyrna, GA (US); Kerry O'Brate, Decatur, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/315,883

(22) Filed: Jun. 26, 2014

(65) Prior Publication Data

US 2014/0308617 A1 Oct. 16, 2014

Related U.S. Application Data

(63) Continuation of application No. 12/826,773, filed on Jun. 30, 2010, now Pat. No. 8,795,950.

(51) Int. Cl.
| | |
|---|---|
| *G03F 7/11* | (2006.01) |
| *G03F 7/20* | (2006.01) |
| *G03F 7/24* | (2006.01) |
| *G03F 7/09* | (2006.01) |

(52) U.S. Cl.
CPC ............. *G03F 7/2002* (2013.01); *G03F 7/092* (2013.01); *G03F 7/11* (2013.01); *G03F 7/24* (2013.01)

(58) Field of Classification Search
CPC .................................. G03F 7/2002; G03F 7/11
USPC ......................................................... 430/306
See application file for complete search history.

(56) References Cited

U.S. PATENT DOCUMENTS

| | | | |
|---|---|---|---|
| 5,607,814 A * | 3/1997 | Fan et al. ........................ 430/258 |
| 2004/0115562 A1* | 6/2004 | Kaczun et al. ............. 430/286.1 |
| 2006/0112844 A1* | 6/2006 | Hiller et al. ................. 101/463.1 |
| 2007/0122748 A1* | 5/2007 | Bryant et al. ................. 430/302 |
| 2008/0141880 A1* | 6/2008 | Daniel et al. .................. 101/327 |
| 2008/0226348 A1* | 9/2008 | Kim et al. ..................... 399/227 |
| 2010/0173135 A1* | 7/2010 | Choi et al. ................. 428/195.1 |
| 2011/0081614 A1* | 4/2011 | Recchia ........................ 430/306 |

* cited by examiner

*Primary Examiner* — Chanceity Robinson
(74) *Attorney, Agent, or Firm* — Carmody Torrance Sandak & Hennessey LLP (57) ABSTRACT

A method of making a relief image printing element from a photosensitive printing blank is provided. The method comprising the steps of: 1) providing a photosensitive printing blank comprising a backing layer, at least one layer of photoresin on top of the backing layer and a removable coversheet on top of the at least one layer of photoresin; 2) imaging the photosensitive printing blank through the removable coversheet using a laser to create a relief image therein; and 3) removing the removable coversheet.

15 Claims, 5 Drawing Sheets

METHOD FOR IMPROVING PRINT PERFORMANCE IN FLEXOGRAPHIC PRINTING PLATES

FIELD OF THE INVENTION

The present invention relates generally to a method of imaging a relief image printing element to provide an improved relief structure thereon.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of a backing, or support layer; one or more unexposed photocurable layers; a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyolefins, polyamides, and the like. The support sheet can optionally comprise an adhesive layer for more secure attachment to the photocurable layer(s). Optionally, an antihalation layer may also be provided between the support layer and the one or more photocurable layers. The antihalation layer is used to minimize halation caused by the scattering of UV light within the non-image areas of the photocurable resin layer.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Examples of photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may also be used.

The photocurable materials generally cross-link (cure) and harden through radical polymerization in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions. One commonly used source of actinic radiation is a mercury arc lamp, although other sources are generally known to those skilled in the art.

The slip film is a thin layer, which protects the photopolymer from dust and increases its ease of handling. In a conventional ("analog") plate making process, the slip film is transparent to UV light. In this process, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter. The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a press and printing commenced.

The shape of the dots and the depth of the relief, among other factors, affect the quality of the printed image. It is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (the dot is not "held" on plate and/or on press). Alternatively, if the dot survives processing they are susceptible to damage on press. For example small dots often fold over and/or partially break off during printing causing either excess ink or no ink to be transferred.

Furthermore, photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore desirable for the dissolved oxygen to be removed from the resin composition before image-wise exposure so that the photocurable resin composition can be more rapidly and uniformly cured.

The removal of dissolved oxygen can be accomplished, for example, by placing the photosensitive resin plate in an atmosphere of inert gas, such as carbon dioxide gas or nitrogen gas, before exposure in order to displace the dissolved oxygen. A noted drawback to this method is that it is inconvenient and cumbersome and requires a large space for the apparatus.

Another approach that has been used involves subjecting the plates to a preliminary exposure (i.e., "bump exposure") of actinic radiation. During bump exposure, a low intensity "pre-exposure" dose of actinic radiation is used to sensitize the resin before the plate is subjected to the higher intensity main exposure dose of actinic radiation. The bump exposure is applied to the entire plate area and is a short, low dose exposure of the plate that reduces the concentration of oxygen, which inhibits photopolymerization of the plate (or other printing element) and aids in preserving fine features (i.e., highlight dots, fine lines, isolated dots, etc.) on the finished plate. However, the pre-sensitization step can also cause shadow tones to fill in, thereby reducing the tonal range of the halftones in the image.

The bump exposure requires specific conditions that are limited to only quench the dissolved oxygen, such as exposing time, irradiated light intensity and the like. In addition, if the photosensitive resin layer has a thickness of more than 0.1 mm, the weak light of the low intensity bump exposure dose does not sufficiently reach certain portions of the photosensitive resin layer (i.e., the side of the photosensitive layer that is closest to the substrate layer and furthest from the source of actinic radiation), at which the removal of the dissolved oxygen is insufficient. In the subsequent main exposure, these portions will not cure sufficiently due to the remaining oxygen. In an attempt to fix this problem, a selective preliminary exposure, as discussed for example in U.S. Patent Publication No. 2009/0043138 to Roberts et al., the subject matter of which is herein incorporated by reference in its entirety, has been proposed. Other efforts have involved special plate formulations alone or in combination with the bump exposure.

For example, U.S. Pat. No. 5,330,882 to Kawaguchi, the subject matter of which is herein incorporated by reference in its entirety, suggests the use of a separate dye that is added to the resin to absorb actinic radiation at wavelengths at least 100 nm removed from the wavelengths absorbed by the main photoinitiator. This allows separate optimization of the initiator amounts for the bump and main initiators. Unfortunately, these dyes are weak initiators and require protracted bump exposure times. In addition, these dyes sensitize the resin to regular room light, so inconvenient yellow safety light is required in the work environment. Lastly, the approach described by Kawaguchi employs conventional broadband-type sources of actinic radiation light for bump exposure, and thereby also tends to leave significant amounts of oxygen in the lower layers of the resin.

U.S. Pat. No. 4,540,649 to Sakurai, incorporated herein by reference in its entirety, describes a photopolymerizable composition that contains at least one water soluble polymer, a photopolymerization initiator and a condensation reaction product of N-methylol acryl amide, N-methylol methacrylamide, N-alkyloxymethyl acrylamide or N-alkyloxymethyl methacrylamide and a melamine derivative. According to the inventors, the composition eliminates the need for pre-exposure conditioning and produces a chemically and thermally stable plate.

There is also a need for an improved relief image printing element that comprises an improved relief structure including printing dots that are configured for superior printing performance on various substrates.

In an alternative to the "direct to plate" plate making process, a direct write or laser engraving process can be employed in which a relief suitable for printing is engraved directly into a layer suitable for this purpose. Direct write technology employs laser light to directly and selectively image a photoresin that has been previously cured to create a relief printing element. By the action of laser radiation, layer components or their degradation products are removed in the form of hot gases, vapors, fumes, droplets or small particles and nonprinting indentations are thus produced. Improvements in laser technology have increased interest in direct write and laser engraving processes, including better focusing ability of the laser beam, higher power, multiple laser beam or laser source combinations and computer-controlled beam guidance.

One of the major benefits of the direct write process is that the cost of plate making is reduced significantly due to faster imaging and reduction of number of steps. The total elimination of the mask also eliminates issues with regards to handling, fragility, extraction of fumes, debris and contamination of the wash out solvents. Direct write also allows for more degrees of freedom to optimize plate imaging. Setting specific imaging parameters associated with high quality laser light leads to high performance plate imaging. A better control of parameters also leads to better repeatability and reliability of plate making.

The direct write printing element blank typically comprises a support or backing layer, one or more layers of photoresin and a removable coversheet.

In addition, one of the problems associated with direct write/laser engraving technology is that atmospheric oxygen inhibits the curing reaction at the surface, which results in poor curing in the outermost layer of photoresin. This is manifested by large differences between the target (file) dot size and the resulting imaged dot size, scan line artifacts in the plate surface after imaging, and unacceptably high surface roughness after thermal processing. To remedy these technical issues, it is critical to obtain thoroughly cured surfaces of the photoresins.

Previous method of remedying these issues focused on employing extra treatments or additional procedures such as the addition of one or more extra layers in the structure of the flexographic printing plates during or after manufacturing. However, this increases raw materials costs and/or creates additional procedures in the work flow that may introduce sources of variations in quality and thus require additional quality control.

The removal of atmospheric oxygen has been accomplished, for example, by placing the photosensitive resin plate in an atmosphere of inert gas, such as carbon dioxide gas or nitrogen gas, overnight before exposure in order to displace the dissolved oxygen. A noted drawback to this method is that it is inconvenient and cumbersome and requires a large space for the apparatus.

Other efforts have focused on adding an oxygen scavenger to the resin composition to suppress the action of the oxygen. The use of oxygen scavengers in resin systems is described, for example, in U.S. Pat. No. 3,479,185 to Chambers, Jr. and in U.S. Pat. No. 4,414,312 to Goff et al., the subject matter of each or which is herein incorporated by reference in its entirety.

Thus, there remains a need for an improved process for preparing relief image printing elements using direct write technology that overcomes the problems associated with atmospheric oxygen inhibition.

SUMMARY OF THE INVENTION

It is an object of the present invention to create a relief image printing element that comprises printing dots having a superior dot structure in terms of print surface, edge definition, shoulder angle, depth and dot height.

It is another object of the present invention to control the surface roughness of the print surface of the relief image printing element.

It is another object of the present invention to obtain well-defined dot shapes and thoroughly cured solid surface by achieving good surface cure of flexographic printing elements that are imaged using a direct write technology.

It is another object of the present invention to address problems associated with atmospheric oxygen inhibition when using direct write technology.

It is still another object of the present invention to provide an improved means of controlling the surface roughness of the print surface of the relief image printing element.

To that end, the present invention relates generally to a method of imaging a flexographic printing blank to create a relief image therein, the method comprising the steps of:

a) providing a flexographic printing blank comprising a backing layer, at least one layer of photoresin on top of the backing layer and a removable coversheet on top of the at least one layer of cured photoresin;

b) imaging the at least one layer of photoresin through the removable coversheet to create the relief image therein, preferably using a laser; and c) thereafter, removing the removable coversheet.

DETAILED DESCRIPTION OF THE INVENTION

The inventors of the present invention have found that the shape and structure of a printing dot has a profound impact on the way it prints. Knowing this, one can manipulate the resultant shape of the printing dots by the methods as described herein.

Figure 1:
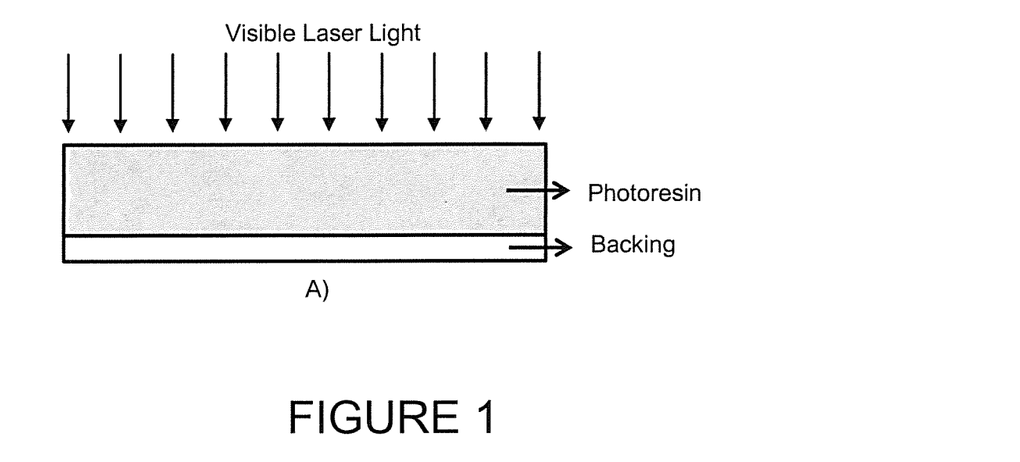
FIG. 1 depicts a flexographic printing plate blank with the coversheet removed prior to imaging.

A typical structure of a flexographic printing plate blank that can be imaged using direct write technology comprises a backing sheet, at least one layer of photoresin and coversheet on which a slip film and/or functional films may be coated. Typically, the coversheet is removed prior to imaging as illustrated in FIG. 1.

Figure 2:
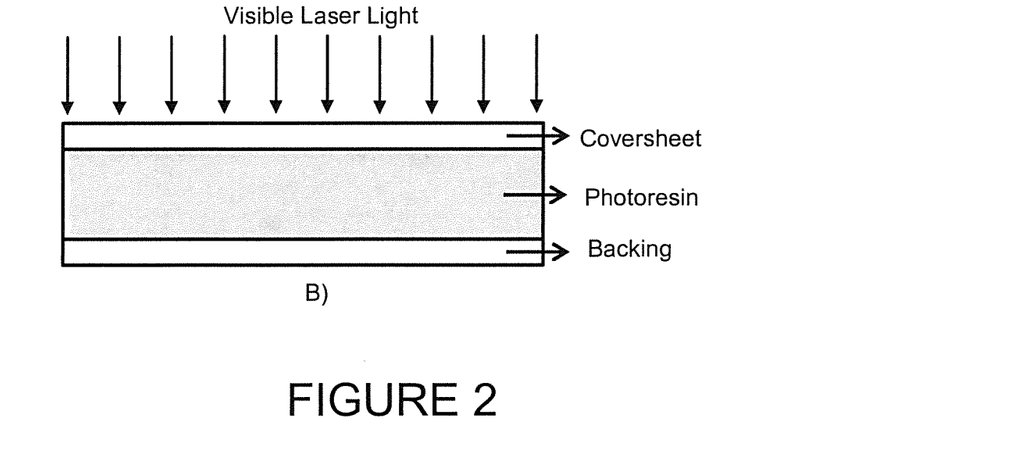
FIG. 2 depicts a flexographic printing plate blank with the coversheet remaining on the printing plate blank during imaging.

However, the inventors of the present invention have surprisingly found that substantial improvements in imaging are achieved if the coversheet remains on the plate during imaging and is then peeled off upon completion of the imaging as illustrated in FIG. 2.

To that end, in a preferred embodiment, the present invention relates to a method of imaging a flexographic printing blank to create a relief image therein, the method comprising the steps of:

a) providing a flexographic printing blank comprising a backing layer, at least one layer of a photoresin on top of the backing layer and a removable coversheet on top of the at least one layer of photoresin;

b) imaging the at least one layer of photoresin through the removable coversheet to create a relief image therein, preferably using a laser; and c) thereafter, removing the removable coversheet.

The coversheet must be transparent to actinic radiation so that the printing element can be imaged through the cover sheet. The removable coversheet typically comprises a material selected from the group consisting of polyamides, polyvinyl alcohol, hydroxyalkyl cellulose, copolymers of ethylene and vinyl acetate, amphoteric interpolymers, cellulose acetate butyrate, alkyl cellulose, butyral, cyclic rubbers, polypropylene, polyethylene, polyvinyl chloride, polyester and combinations of one or more of the foregoing. In a preferred embodiment, the removable coversheet comprises polyethylene terephthalate. Examples of coversheets usable in the practice of the present invention include, but are not limited to, DTF625 polyethylene terephthalate films, available from DuPont-Teijin Films and LM-3040-4 polyethylene terephthalate films available from MacDermid Printing Solutions.

A laser is preferably used. However, imaging can also be accomplished by placing a photonegative on top of the cover sheet and then flooding the photonegative with light of an appropriate wavelength. The laser used is preferably a UV laser that is capable of operating at a wavelength within the range of about 250 to 420 nm. An example of a suitable laser imager is the Xpose! UV system available from Lüscher AG.

The direct write laser has a scanning speed of between about 500 and about 600 rpm. More preferably, the laser has a scanning speed of about 550 rpm. In addition, the direct write laser typically comprises a multi-pass imaging protocol. As a result, the dots created in the at least one layer of photoresin have a flat top and are well-defined. As well, laser scan lines are not visible on the top of the dot.

In one preferred embodiment, the average surface roughness of the dots is about 2000 nm. In another preferred embodiment, the average surface roughness is less than about 2000 nm.

The photoresin usable in the practice of the invention is typically a photosensitive resin that is curable using actinic radiation prior to the imaging the step. The photosensitive photoresin typically comprises a crosslinkable elastomeric compound, a plasticizing compound, monomeric binder compounds and one or more photoinitiator compounds.

The inventors herein have discovered that the most important method of beneficially changing the shape of printing dots formed on a printing element is removing or limiting diffusion of air into the photocurable layer during exposure to actinic radiation.

Altering the type, power and incident angle of illumination can also be useful in this regard and can be accomplished by multiple methods. A fully coherent (e.g., laser) light source can be used for exposure. Examples of the laser light sources include UV laser diodes used in devices such as the Lüscher Xpose! imager and the Heidelberg Prosetter imager. Other light sources that can alter the type, power and incident angle of illumination can also be used in the practice of the invention.

A wide range of materials can serve as the barrier layer. Three qualities that the inventors have identified in producing effective barrier layers include optical transparency, low thickness and oxygen transport inhibition. Oxygen transport inhibition is measure in terms of a low oxygen diffusion coefficient. As noted, the oxygen diffusion coefficient of the membrane (or the liquid layer) should be less than $6.9 \times 10^{-9}$ m$^2$/sec., preferably less than $6.9 \times 10^{-10}$ m$^2$/sec. and most preferably less than $6.9 \times 10^{-11}$ m$^2$/sec.

Examples of materials which are suitable for use as the barrier layer of the present invention include those materials that are conventionally used as a release layer in flexographic printing elements, such as polyamides, polyvinyl alcohol, hydroxyalkyl cellulose, copolymers of ethylene and vinyl acetate, amphoteric interpolymers, cellulose acetate butyrate, alkyl cellulose, butryal, cyclic rubbers, and combinations of one or more of the foregoing. In addition, films such as polypropylene, polyethylene, polyvinyl chloride, polyester and similar clear films can also serve well as barrier films. In one preferred embodiment, the barrier membrane layer comprises a polypropylene film or a polyethylene terephthalate film.

The barrier thickness should be consistent with the structural needs for handling of the film and the film/photopolymer plate combination. Barrier thicknesses between about 5 and 300 microns are preferred, with thickness of between about 10 and about 200 microns being most preferred.

The barrier needs to have a sufficient optical transparency so that the barrier will not detrimentally absorb or deflect the actinic radiation used to expose the photosensitive printing blank. As such it is preferable that the barrier have an optical transparency of at least 50%, most preferably at least 75%.

The barrier needs to be sufficiently impermeable to oxygen diffusion so that it can effectively limit diffusion of oxygen into the photocurable layer during exposure to actinic radiation. The inventors herein have determined that the barrier materials noted above in the thicknesses noted above will substantially limit the diffusion of oxygen into the photocurable layer when used as described herein.

In addition to limiting the diffusion of oxygen into the photocurable layer, the barrier can be used to impart or impress a desired texture to the printing surfaces of the printing element or to control the surface roughness of the printing surfaces of the printing element to a desired level. In one embodiment of the present invention, the barrier comprises a matte finish and the texture of the matte finish may be transferred to the plate surface to provide a desired surface roughness on the surface of the printing plate. For example, in one embodiment, the matte finish provides an average surface roughness that is between about 700 and about 800 nm. In this instance the barrier comprises a polypropylene film with a cured photopolymer layer thereon and the cured photopolymer layer has a defined topographic pattern defined thereon. The texture or roughness of the barrier membrane surface will be impressed into the surface of the photopolymer (photocurable) layer during the lamination step. In general, surface roughness in this regard can be measured using a Veeco Optical Profilometer, model Wyko NT 3300 (Veeco Instruments, Plainville, N.Y.).

In another embodiment of the present invention, the barrier comprises a smooth nanotechnology film with a roughness of less than 100 nm. In this embodiment, the average surface roughness of the printing plate can be controlled to less than about 100 nm.

The barrier layer may be laminated to the surface of the printing plate using pressure and/or heat in a typical lamination process.

After the photosensitive printing blank is exposed to actinic radiation as described herein, the printing blank is developed to reveal the relief image therein. Development may be accomplished by various methods, including water development, solvent development and thermal development, by way of example and not limitation.

Finally, the relief image printing element is mounted on a printing cylinder of a printing press and printing is commenced.

EXAMPLE

A direct write photoresin, comprising a crosslinkable elastomeric compound, a plasticizing compound, monomeric binder compounds, and a set of one or more photoinitiator compounds was utilized to demonstrate the advantages realized by the present invention.

The imaging process was conducted using a Lüscher Xpose! direct write laser at a power of 95 mW/cm$^2$, a laser scanning speed of 550 rpm, with six scans made in a multi-pass imaging protocol with dot areas of 70%, 15%, and 1%, 1%, 1% and 1% on successive passes.

The imaging process was conducted using two different methods. In the first method, the imaging was conducted with the coversheet removed as a comparative example. In the second method, which is in accordance with the present invention, the imaging was conducted with the coversheet remaining on the photoresin during the imaging step.

Figure 3:
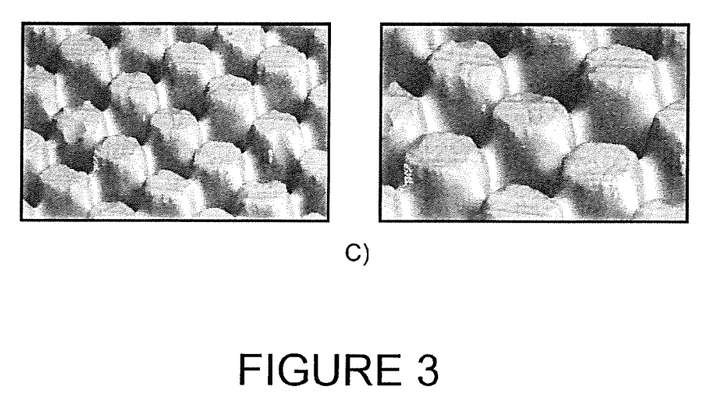
FIG. 3 depicts SEM photographs of the dot geometries of a flexographic printing plate blank with the coversheet removed prior to imaging.
Figure 4:
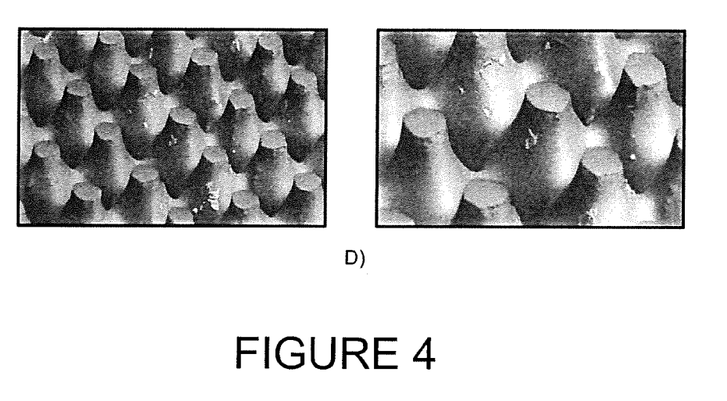
FIG. 4 depicts SEM photographs of the dot geometries of a flexographic printing plate blank when processed with a coversheet remaining in place on the printing plate blank during the direct write imaging step.
Figure 5:
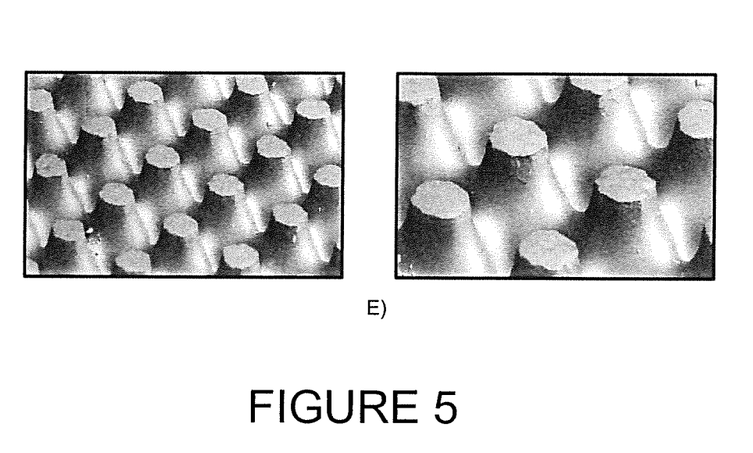
FIG. 5 depicts SEM photographs of the dot geometries of a flexographic printing plate when processed with a different coversheet remaining in place on the printing plate blank during the imaging step.

The resulting dot geometries obtained from these two methods are very different as shown in FIGS. 3-5.

FIG. 3 depicts SEM photographs of minimum dots held at 133 lines per inch (lpi) when the coversheet was removed prior to imaging as illustrated in FIG. 1. The intended size of the dot (the size in the electronic file used for imaging) was 40% but the actual dot size on the plate measures 24%, which indicates poor surface cure due to oxygen inhibition. This poor surface cure is also evident from the laser canning lines visible on the poorly defined dot tops. These scan lines may adversely influence the printing performance of the plate.

FIGS. 4 and 5 depict SEM photographs of the same photoresin imaged using the same protocol, but with coversheets (DTF625 and LM-3040-4 polyethylene terephthalate films, respectively) left on the plate surface during imaging as described above and as illustrated in FIG. 3.

The intended size of the dots shown in FIG. 4 (the size in the electronic file used for imaging) is 9% and the actual dot size on the plate measures 11%. The size of minimum dots held reduces from 24% to 11% if the coversheet remains on the plate during imaging, which demonstrates that the use of the coversheet allowed the creation of smaller dots. Also, the laser scanning lines are not seen on the dot tops, which are also sharply defined. The results indicate that the surface cure, as well as the overall imaging fidelity, is greatly enhanced by the presence of the coversheet in the plate structure during imaging.

FIG. 5 depicts similar results obtained with a different coversheet. The dot size in the electronic file is 15% and the actual dot size is 16%. Again, no laser scanning lines are observed and the dot tops are flat and well-defined, which is desirable for good printing performance.

Figure 6:
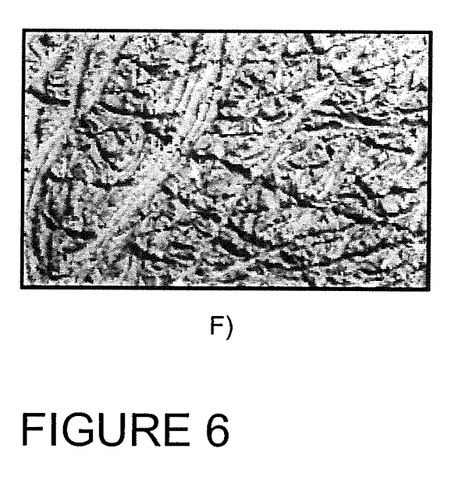
FIG. 6 depicts an SEM photographic of a solid area of a flexographic printing plate processed with the coversheet removed prior to imaging.

The imaging method of the present invention also allows a considerable improvement of the thermal processing capability of the photopolymer. FIG. 6 depicts the surface of the solid area of the photopolymer imaged without a coversheet when it was processed thermally.

Figure 7:
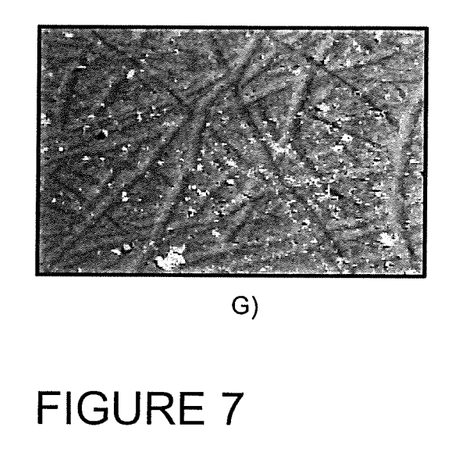
FIG. 7 depicts an SEM photograph of a solid area of a flexographic printing plate processed with the first coversheet remaining in place on the photoresin layer during the imaging step.
Figure 8:
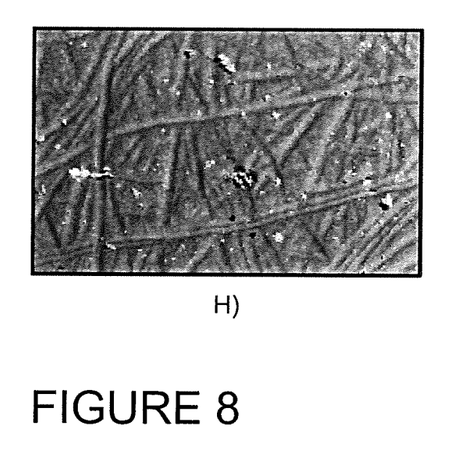
FIG. 8 depicts an SEM photograph of a solid area of a flexographic printing plate processed with a different coversheet remaining in place on the photoresin layer during the imaging step.
Figure 9:
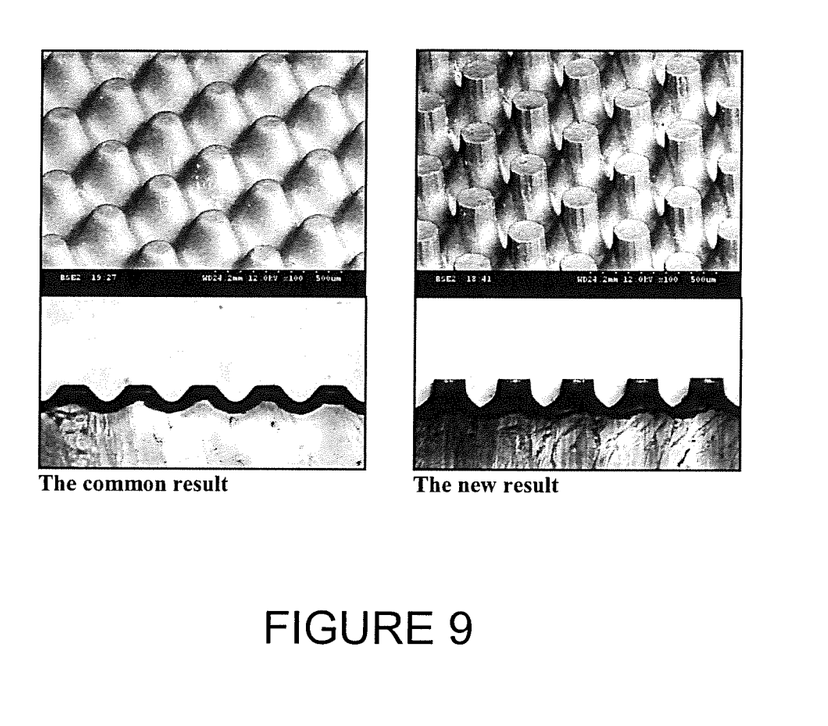
FIG. 9 depicts a printing element with a plurality of dots demonstrating the unique dot/shoulder structure of the invention as compared to the dots of a printing element exposed without the benefit of this invention.

On the other hand, FIGS. 7 and 8 show solid areas of printing plates imaged with the coversheets of DTF625 and LM-3040-4, respectively, remaining on the plate during imaging. The surface of the photopolymer is much smoother if imaged with the coversheet on, as summarized in Table 1.

TABLE 1

Surface Roughness (SR) of photoresin with respect to coversheet employed
Direct Write Photoresin

|  | No Coversheet | DTF625 | LM-3040-4 |
| --- | --- | --- | --- |
| Avg. SR ($R_a$, nm) | 13,739 | 1,915 | 2,002 |

After the photosensitive printing blank is imaged using a direct write laser as detailed herein, the removable coversheet is removed. Finally, the relief image printing element is mounted on a printing cylinder of a printing press and printing is commenced.

As can be seen, the process of the present invention does not require extra treatment and no added procedure is required. Thus, there is no negative impact on raw material costs, quality and/or work flow. In fact, imaging plates with the coversheet on minimizes potential damage to the plates and therefore helps in plate handling.

What is claimed is:

1. A method of imaging a flexographic printing blank, the method comprising the steps of:
    a) providing a photosensitive printing blank comprising a backing layer, at least one layer of photoresin on top of the backing layer and a removable coversheet directly on top of the at least one layer of photoresin;
    b) imaging the at least one layer of photoresin through the removable coversheet using a laser to cure the at least one layer of photoresin and create a relief image therein; and
    c) thereafter, removing the removable coversheet.

2. The method according to claim 1, wherein the removable coversheet is transparent.

3. The method according to claim 2, wherein the removable coversheet comprises a material selected from the group consisting of polyamides, polyvinyl alcohol, hydroxyalkyl cellulose, copolymers of ethylene and vinyl acetate, amphoteric interpolymers, cellulose acetate butyrate, alkyl cellulose, butyral, cyclic rubbers, polypropylene, polyethylene, polyvinyl chloride, polyester and combinations of one or more of the foregoing.

4. The method according to claim 3, wherein the removable coversheet comprises polyethylene terephthalate.

5. The method according to claim 1, wherein the laser operates in the UV range and scans the surface of the at least one layer of photoresin through the coversheet.

6. The method according to claim 5, wherein the laser is a laser diode operating at a wavelength of 405 nm.

7. The method according to claim 5, wherein the laser scans the at least one layer of photoresin at a scanning speed of between 500 and 600 rpm.

8. The method according to claim 7, wherein the laser scans the at least one layer of photoresin at a scanning speed of 550 rpm.

9. The method according to claim 5, wherein the laser scans the at least one layer of photoresin using a multi-pass imaging protocol.

10. The method according to claim 1, where dots created in the at least one layer of photoresin by the laser have a flat top.

11. The method according to claim 10, wherein a minimum dot size held in the at least one layer of photoresin is 11% or less.

12. The method according to claim 11, wherein laser scan lines are not visible on the relief image formed in the at least one layer of photoresin.

13. The method according to claim 12, wherein the average surface roughness of the dots created in the at least one layer of photoresin is 2000 nm.

14. The method according to claim 12, wherein the average surface roughness of the dots created in the at least one layer of photoresin is less than 2000 nm.

15. The method according to claim 1, wherein the at least one layer of photoresin comprises a crosslinkable elastomeric compound, a plasticizing compound, monomeric binder compounds and one or more photoinitiator compounds.

\* \* \* \* \*